(12) United States Patent
Chen

(10) Patent No.: US 8,748,313 B2
(45) Date of Patent: Jun. 10, 2014

(54) ELECTROFORMING TECHNIQUE FOR MASK FORMATION

(75) Inventor: Hsin Chin Chen, Shanghai (CN)

(73) Assignees: Semiconductor Manufaturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 12/897,618

(22) Filed: Oct. 4, 2010
(Under 37 CFR 1.47)

(65) Prior Publication Data
US 2012/0115328 A1 May 10, 2012

(30) Foreign Application Priority Data

Oct. 23, 2009 (CN) .......................... 2009 1 0197615

(51) Int. Cl.
*H01L 21/44* (2006.01)
(52) U.S. Cl.
USPC ........... 438/669; 438/552; 438/670; 438/671; 438/674; 438/678; 438/685; 257/91; 257/98; 257/435; 257/E21.159
(58) Field of Classification Search
None
See application file for complete search history.

(56) References Cited

U.S. PATENT DOCUMENTS

| 4,507,181 A | * | 3/1985 | Nath et al. | 205/91 |
| 4,670,365 A | * | 6/1987 | Yoshihara | 430/5 |
| 5,885,749 A | * | 3/1999 | Huggins et al. | 430/312 |
| 2003/0155231 A1 | * | 8/2003 | Weng | 204/227 |
| 2005/0189228 A1 | * | 9/2005 | Huang | 205/157 |

FOREIGN PATENT DOCUMENTS

| CN | 1591180 A | 3/2005 |
| CN | 101452203 A | 6/2009 |
| JP | 54087069 | * 7/1979 |

* cited by examiner

*Primary Examiner* — Yasser A Abdelaziez
(74) *Attorney, Agent, or Firm* — Kilpatrick Townsend & Stockton LLP

(57) ABSTRACT

A method for making a mask for semiconductor manufacturing. The method includes providing a base layer, forming a conductive layer on the base layer, and forming a photoresist layer on the conductive layer. Additionally, the method includes exposing selectively the photoresist layer to an energy illumination, developing the photoresist layer by removing a first portion of the photoresist layer, and depositing a metal layer by an electroforming process. The electroforming process includes submerging the conductive layer into a chemical bath, and applying a deposition voltage across a negative electrode and a positive electrode. Moreover, the method includes removing a second portion of the photoresist layer, and removing a first portion of the conductive layer.

15 Claims, 5 Drawing Sheets

ELECTROFORMING TECHNIQUE FOR MASK FORMATION

CROSS-REFERENCES TO RELATED APPLICATIONS

This application claims priority to Chinese Patent No. 200910197615.7, filed Oct. 23, 2009 commonly assigned herewith and incorporated in its entirety by reference herein for all purposes.

BACKGROUND OF THE INVENTION

The present invention is directed to integrated circuits and their processing for the manufacture of semiconductor devices. More particularly, the invention provides a method and device for manufacturing a photolithography mask with electroforming technique. Merely by way of example, the invention has been applied to one or more masks for the manufacture of integrated circuits. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to procure mask sets that provide high pattern fidelity and high device reliability.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor Manufacturing International Corporation (SMIC) of Shanghai, China is an example of a chip company that performs foundry services. Although fabless chip companies and foundry services have increased through the years, many limitations still exist. For example, mask sets used for the manufacture of the custom integrated circuits can usually provide only limited pattern fidelity and device reliability. If a mask set provides a metal-line pattern that is narrower than the design specification, the fabricated metal line may be over-etched and create an undesirable open circuit. These and other limitations are described throughout the present specification and more particularly below.

FIGS. 1-7 are simplified diagrams for a conventional method of making a photolithography mask. The method includes process 110 for quartz layer formation, process 120 for chromium layer formation, process 130 for anti-reflection layer formation, process 140 for photoresist layer formation, process 150 for photoresist layer exposure, process 160 for photoresist layer development, and process 170 for chromium layer etching and photoresist layer stripping. At process 110 for quartz layer formation, quartz layer 112 is fabricated. At process 120 for chromium layer formation, chromium layer 122 is deposited by sputtering on quartz layer 112. At process 130 for anti-reflection layer formation, anti-reflection layer 132 is deposited by sputtering on chromium layer 122. For example, anti-reflection layer 132 is composed of chromium oxide. At process 140 for photoresist layer formation, photoresist layer 142 is coated onto anti-reflection layer 132. For example, photoresist layer 142 is composed of positive photoresist. Positive photoresist usually includes large molecules. Upon exposure, the large molecules can be converted into small molecules, and small molecules can usually dissolve fast in certain chemical solutions. At process 160 for photoresist development, portions of photoresist layer 142 are removed, and remaining portions of photoresist layer 142 subsequently form photoresist pattern 162. As shown in FIG. 6, photoresist pattern 162 includes photoresist sub-layers 164. At process 170 for chromium layer etching and photoresist layer stripping, portions of anti-reflection layer 132 are removed, and remaining portions of anti-reflection layer 132 form anti-reflection pattern 172. Anti-reflection pattern 172 includes anti-reflection sub-layers 174. Etching anti-reflection layer 132 may use a dry etching process, a wet etching process, or a combination thereof. Similarly, portions of chromium layer 122 are removed, and remaining portions of chromium layer 122 form chromium pattern 176. Chromium pattern 176 includes chromium sub-layers 178. Etching chromium layer 122 may use a dry etching process, a wet etching process, or a combination thereof. With formation of anti-reflection pattern 172 and formation of chromium pattern 176, photoresist pattern 162 is removed. Consequently, quartz layer 112, chromium pattern 176 and anti-reflection pattern 172 form photolithography mask 179. Quartz layer 112 usually provides high transparency for light source used to pattern photoresist layers when photolithography mask 179 is being used.

During the fabrication of photolithography mask 179, photoresist sub-layers 164 may have widths 166 that vary with different sub-layers and differ from desired specifications as shown in FIG. 6. For example, width 166 may be narrower than the desired specification. Consequently, anti-reflection sub-layers 174 and chromium sub-layers 178 may be narrower than the desired specifications as shown in FIG. 7. Thus, metal lines patterned by photolithography mask 179 may have widths narrower than the desired specifications. When the desired specifications shrink to a small feature size, for example 0.13 μm, the fabricated metal lines may contain broken segments and thus create undesirable open circuits. The open circuits decrease yield for semiconductor manufacturing and degrades reliability of semiconductor devices.

Hence, an improved technique for processing semiconductor devices is desired.

BRIEF SUMMARY OF THE INVENTION

The present invention is directed to integrated circuits and their processing for the manufacture of semiconductor devices. More particularly, the invention provides a method and device for manufacturing a photolithography mask with electroforming technique. Merely by way of example, the invention has been applied to one or more masks for the manufacture of integrated circuits. But it would be recognized that the invention has a much broader range of applicability.

In a specific embodiment, the invention provides a method for making a mask for semiconductor manufacturing. The method includes providing a base layer, forming a conductive layer on the base layer, and forming a photoresist layer on the conductive layer. Additionally, the method includes exposing selectively the photoresist layer to an energy illumination, developing the photoresist layer by removing a first portion of the photoresist layer, and depositing a metal layer by an electroforming process. The electroforming process includes submerging the conductive layer into a chemical bath, and applying a deposition voltage across a negative electrode and a positive electrode. The positive electrode is electrically connected to the chemical bath, and the negative electrode is electrically connected to the conductive layer. Moreover, the method includes removing a second portion of the photoresist layer, and removing a first portion of the conductive layer. The first portion of the conductive layer is substantially free from a protection of the metal layer.

According to another embodiment, a method for making a mask for semiconductor manufacturing includes providing a base layer, forming a conductive layer on the base layer, and forming a photoresist pattern on the conductive layer. The photoresist pattern includes a positive photoresist. Additionally, the method includes depositing a metal layer by an electroforming process. The electroforming process includes submerging the conductive layer into a chemical bath, and applying a deposition voltage across a negative electrode and a positive electrode. The positive electrode is electrically connected to the chemical bath, and the negative electrode electrically is connected to the conductive layer. Moreover, the method includes removing the photoresist pattern, and patterning the conductive layer. The patterning uses the metal layer as a protection layer.

Many benefits are achieved by way of the present invention over conventional techniques. For example, the present invention provides an easy to use process that relies upon conventional technology. In some embodiments, a method of the present invention provides photolithography masks with high pattern fidelity. Additionally, in certain embodiments, the method uses negative photoresist instead of positive photoresist for feature size below 0.13 µm. Moreover, the method provides a process that is compatible with conventional process technology without substantial modifications to conventional equipment and processes. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
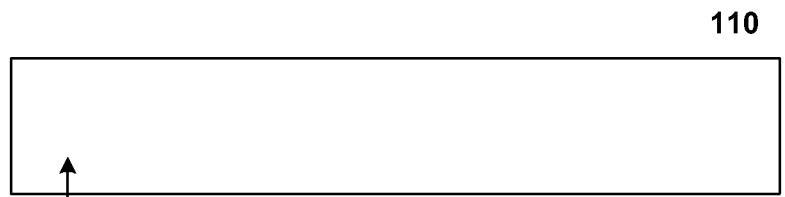
FIGS. 1-7 are simplified diagrams for a conventional method of making a photolithography mask.
Figure 2:
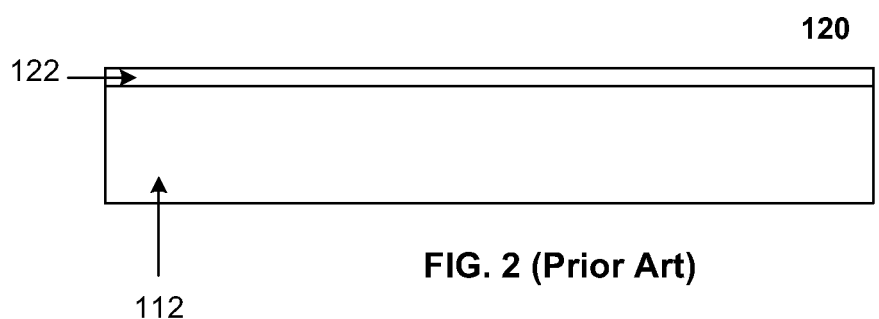
Figure 3:
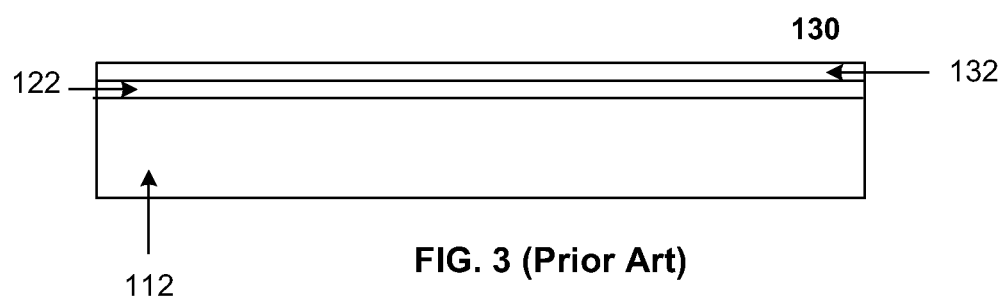
Figure 4:
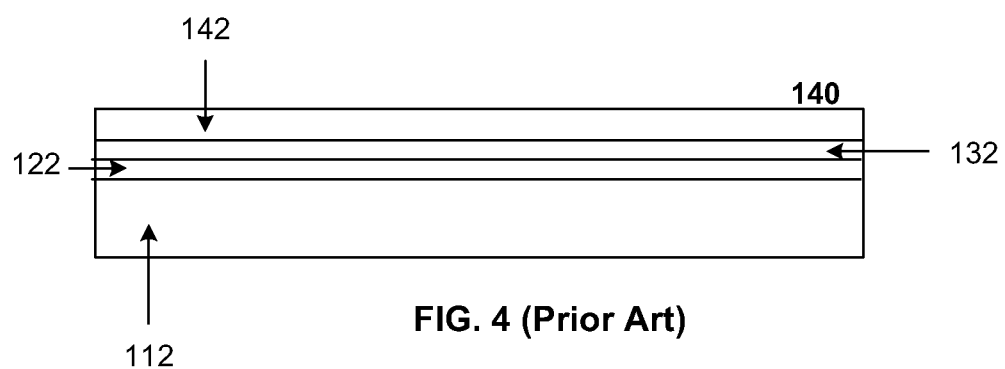
Figure 5:
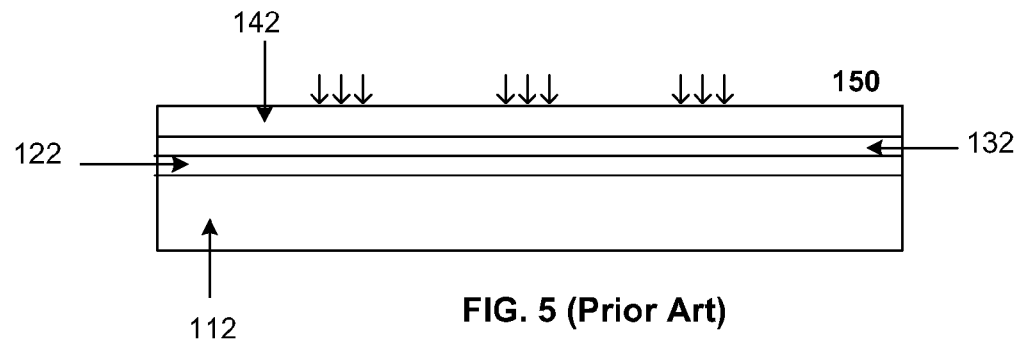
Figure 6:
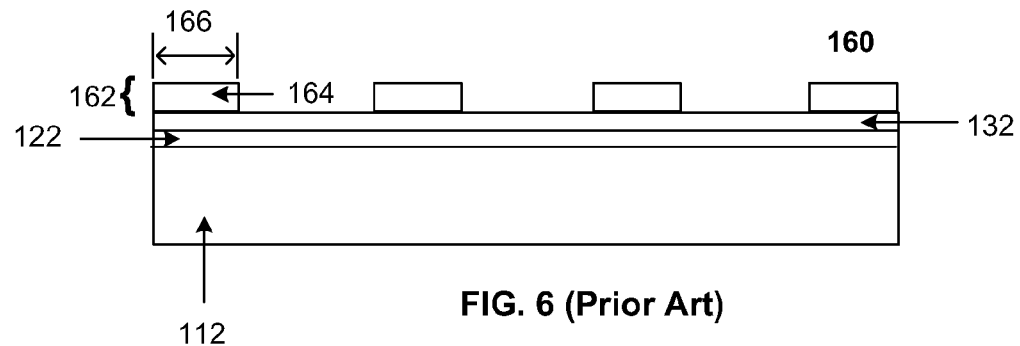
Figure 7:
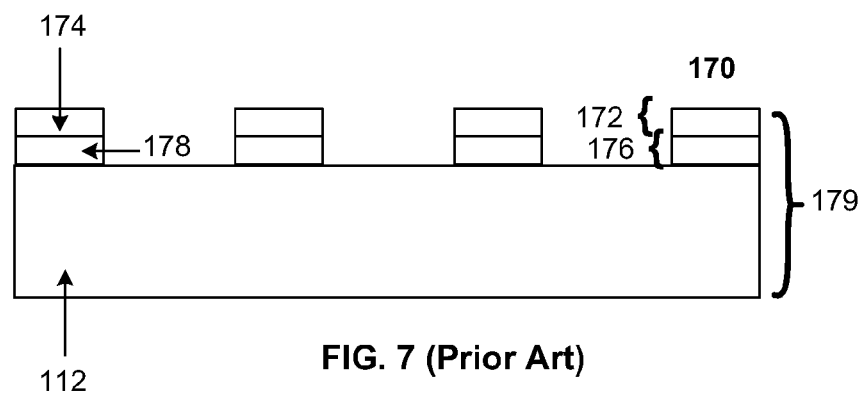
Figure 8:
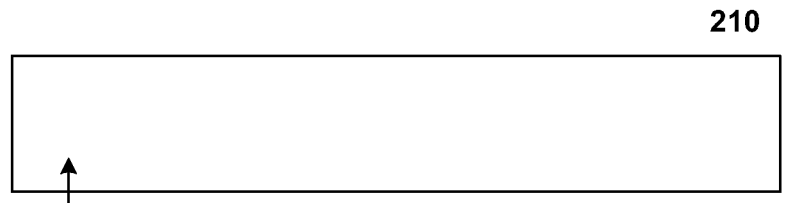
FIGS. 8-16 are simplified diagrams for a method of making a photolithography mask with electroforming technique according to an embodiment of the present invention.
Figure 9:
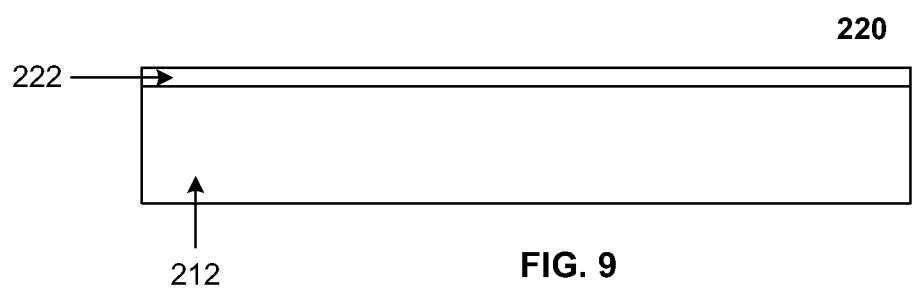
Figure 10:
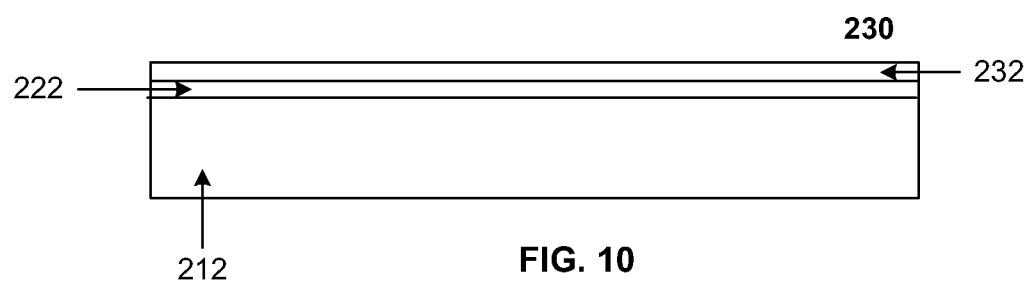
Figure 11:
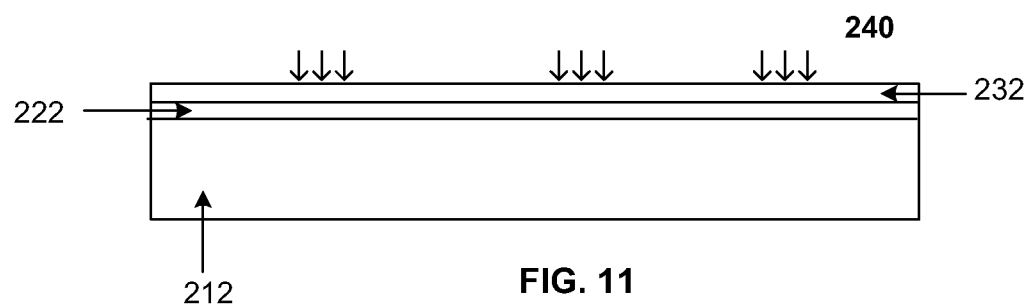

The present invention is directed to integrated circuits and their processing for the manufacture of semiconductor devices. More particularly, the invention provides a method and device for manufacturing a photolithography mask with electroforming technique. Merely by way of example, the invention has been applied to one or more masks for the manufacture of integrated circuits. But it would be recognized that the invention has a much broader range of applicability.

FIGS. 8-16 are simplified diagrams for a method of making a photolithography mask with electroforming technique according to an embodiment of the present invention. These diagrams are merely examples, which should not unduly limit the scope of the claims herein. One of ordinary skill in the art would recognize many variations, alternative, and modification. As shown in FIGS. 8-16, the method includes the following processes:

1. Process 210 for base layer formation;
    2. Process 220 for conductive layer formation;
    3. Process 230 for photoresist layer formation;
    4. Process 240 for photoresist layer exposure;
    5. Process 250 for photoresist layer development;
    6. Processes 260 and 270 for electroforming metal layer;
    7. Process 280 for photoresist removal; and
    8. Process 290 for conductive layer removal.

The above sequence of processes provides a method according to an embodiment of the present invention. Other alternatives can also be provided where one or more processes are added, one or more processes are removed, or one or more processes are provided in a different sequence without departing from the scope of the claims herein. Details of the present invention can be found throughout the present specification and more particularly below.

At process 210 for base layer formation, base layer 212 is fabricated. For example, base layer 212 comprises quartz, soda lime, low expansion material ("LE"), or a combination thereof. Quartz usually provides small thermal expansion and good transparency for light source used to pattern photoresist. Depending on the application, various LE material may be used as deemed appropriate by a person of ordinary skills in the art.

At process 220 for conductive layer formation, conductive layer 222 is fabricated on base layer 212. For example, the fabrication process uses spin on glass technique, sputtering technique, plasma enhanced chemical vapor deposition, low pressure chemical vapor deposition, or combination thereof. Conductive layer 222 may comprise indium tin oxide, other metal or metal alloy.

At process 230 for photoresist layer formation, photoresist layer 232 are fabricated on conductive layer 222. For example, photoresist layer 232 comprises positive photoresist. The positive photoresist may be IP 3600 or IP 3500 manufactured by Tokyo Ohka Kogyo Co., Ltd., with the light source used for patterning photoresist layer 232 being a laser source. Alternatively, the positive photoresist may be PBS with the light source used for patterning photoresist layer 232 being an electron beam source. The positive photoresist may be any photoresist conventionally used for semiconductor fabrication.

At process 240 for photoresist layer exposure, certain regions of photoresist layer 232 are selectively exposed to energy illumination. The energy illumination usually comes from an energy source. For example, the energy source may be a laser source or an electron beam source. The laser source emits a laser beam with a wavelength, such as 365 nm. The electron beam source emits an electron beam with various electron energy. For example, the electron energy may be 50

KeV for a feature size below or equal to 0.13 µm, 20 KeV for a feature size of 0.18 µm, 10 KeV for a feature size of 0.35 µm, or other electron energy.

Figure 12:
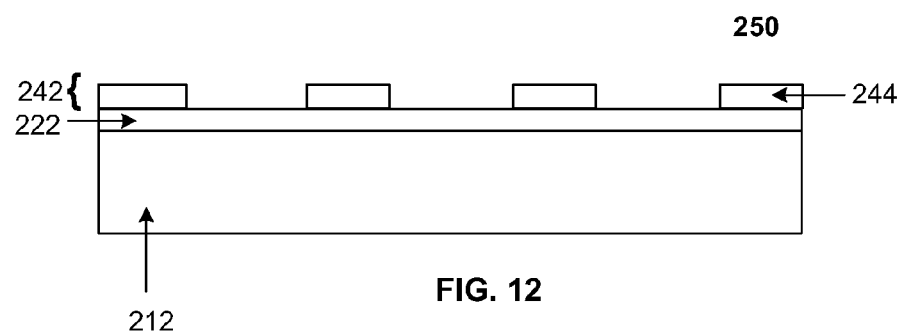

At process 250 for photoresist layer development, portions of photoresist layer 232 are removed, and remaining portions of photoresist layer 232 subsequently form photoresist pattern 242. As shown in FIG. 12, photoresist pattern 242 includes photoresist sub-layers 244. For example, photoresist layer 232 includes positive photoresist, and thus photoresist sub-layers 244 correspond to part of photoresist layer 232 not exposed to the energy illumination. The photoresist layer development may use various types of chemicals, such as CR-33, CR-7, etc.

Figure 13:
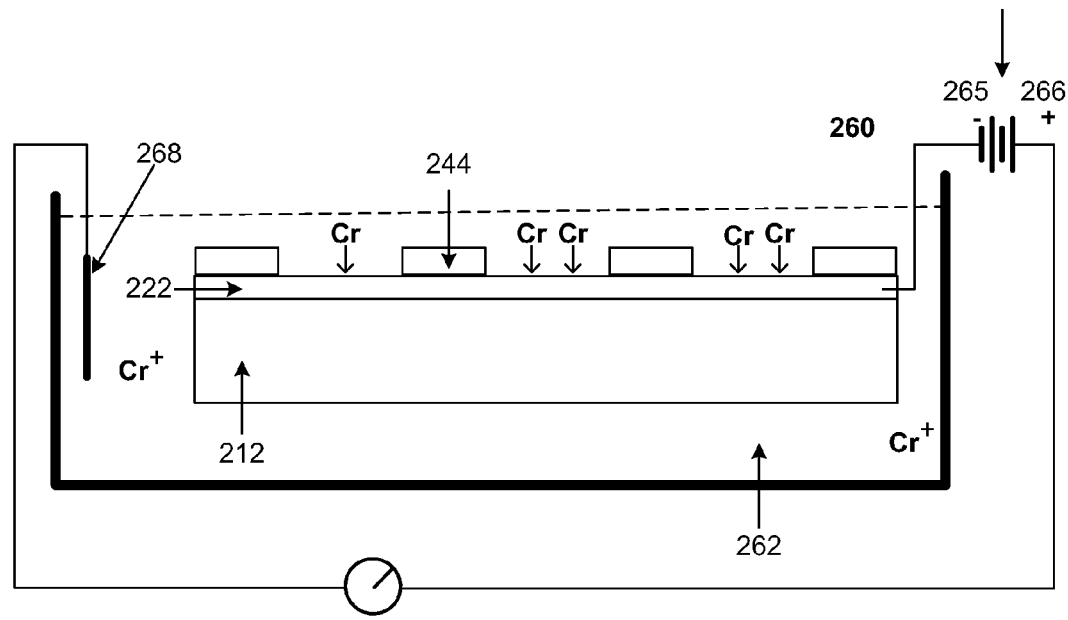

At processes 260 and 270 for electroforming metal layer, metal layer 272 is deposited on conductive layer 222. As shown in FIG. 13, base layer 212, conductive layer 222, and photoresist pattern 244 are submerged into chemical bath 262. Chemical bath 262 are composed of various types of chemical solutions. For example, the chemical solution may be made of a chromium-based solute dissolved into a solvent. Depending on application, the solvent may include one or more types of acid. Power supply 264 has negative electrode 265 and positive electrode 266. Power supply 264 may be one or several batteries or other energy source. Negative electrode 265 is electrically connected to conductive layer 222, and positive electrode 266 is electrically connected to electrode plate 268. Electrode plate 268 is either partially or entirely submerged into chemical bath 262. Thus, electrode plate 268 is at a voltage potential higher than conductive layer 222. In certain embodiments of the present invention, positive chromium ions are attracted to the exposed surface of conductive layer 222. The chemical electroforming process deposits metal layer 272 onto conductive layer 222. The relationship between applied voltage and resulting current flowing through chemical bath 262 may depend upon composition of chemical bath 262. Depending upon the composition of the chemical bath 262, the applied voltage varies. It is to be understood that one of the ordinary skills in the art may determine the applied voltage based on the chemical bath composition.

Figure 14:
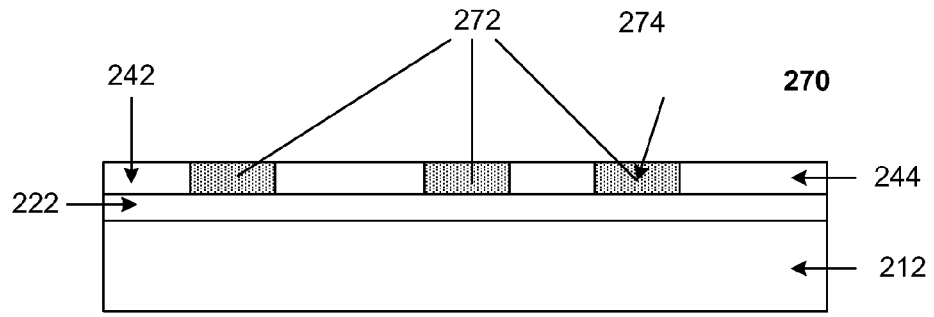
Figure 15:
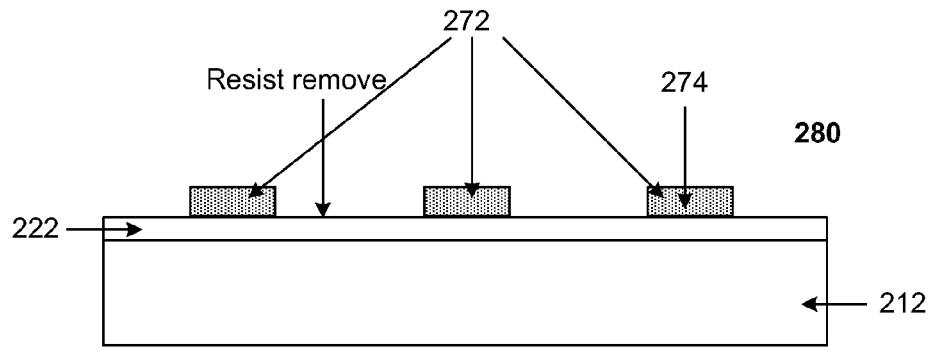

As shown in FIG. 14, for example, metal layer 272 includes metal sub-layers 274. Metal sub-layers 274 are deposited between photoresist sub-layers 244. In one embodiment of the present invention, metal sub-layers 274 completely fill the space between photoresist sub-layers 244. In another embodiment of the present invention, metal sub-layers 274 are isolated from each other by photoresist sub-layers 244. In yet another embodiment of the present invention, metal sub-layers 274 are physically connected to each other by metal sub-layers formed on the surface of photoresist sub-layers 244. Metal sub-layers 274 may comprise chromium, other metal materials, or combinations thereof.

At process 280 for photoresist removal, photoresist pattern 242 is lifted off from the surface of conductive layer 222. Photoresist pattern 242 includes photoresist sub-layers 244. Depending on applications, various types of chemical material may be used for photoresist removal. The chemicals can selectively remove photoresist pattern 242 faster than metal layer 272.

Figure 16:
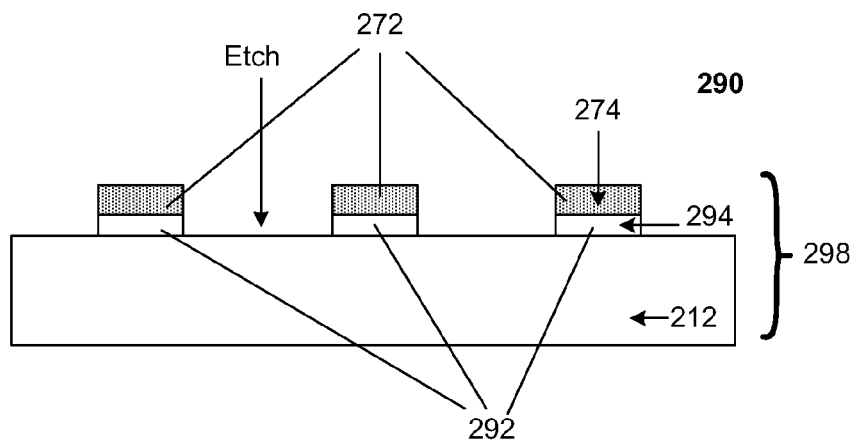

At process 290 for conductive layer removal, portions of conductive layer 222 are removed, and remaining portions of conductive layer 222 subsequently form conductive pattern 292. As shown in FIG. 16, conductive pattern 292 includes conductive sub-layers 294. For example, conductive sub-layers 294 are covered by metal layer 272 including metal sub-layers 274. As a result, base layer 212, conductive pattern 292, and metal layer 272 form photolithography mask 298.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making a mask for semiconductor manufacturing, the method comprising:
   providing a base layer;
   forming a conductive layer on the base layer;
   forming a photoresist layer on the conductive layer;
   exposing selectively the photoresist layer to an energy illumination;
   developing the photoresist layer by removing a first portion of the photoresist layer;
   depositing a metal layer by an electroforming process, wherein the electroforming process includes submerging the conductive layer into a chemical bath, applying a deposition voltage across a negative electrode and a positive electrode, the positive electrode electrically connected to the chemical bath, the negative electrode electrically connected to the conductive layer;
   removing a second portion of the photoresist layer; and
   removing a first portion of the conductive layer, the first portion being substantially free from a protection of the metal layer,
   wherein the conductive layer comprises an indium tin oxide species.

2. The method of claim 1, wherein the electroforming process further comprising:
   depositing a first sub-layer of the metal layer between the second portion of the photoresist layer, wherein the second portion of the photoresist layer includes at least a first photoresist sub-layer and a second photoresist sub-layer, and the first sub-layer of the metal layer is located between the first photoresist sub-layer and the second photoresist sub-layer.

3. The method of claim 2, wherein the first sub-layer of the metal layer is isolated from a second sub-layer of the metal layer, the second sub-layer of the metal layer being located between the second photoresist sub-layer and a third photoresist sub-layer.

4. The method of claim 2, wherein the first sub-layer of the metal layer is connected to a second sub-layer of the metal layer through a third sub-layer of the metal layer.

5. The method of claim 1, wherein the chemical bath comprises a chromium species.

6. The method of claim 1, wherein the metal layer comprises a chromium species.

7. The method of claim 1, wherein the base layer comprises at least one selected from the group consisting of quartz, soda lime, and a low expansion material.

8. The method of claim 1, wherein the energy illumination comprises a laser beam.

9. The method of claim 1, wherein the energy illumination comprises an electron beam.

10. A method for making a mask for semiconductor manufacturing, the method comprising:
    providing a base layer;
    forming a conductive layer on the base layer;
    forming a photoresist pattern on the conductive layer, the photoresist pattern including a positive photoresist;
    depositing a metal layer by an electroforming process, the electroforming process comprising:
    submerging the conductive layer into a chemical bath, and applying a deposition voltage across a negative electrode and a positive electrode, the negative electrode being electrically connected to the chemical bath, the positive electrode being electrically connected to the conductive layer;

removing the photoresist pattern; and patterning the conductive layer, wherein the patterning uses the metal layer as a protection layer, wherein the conductive layer comprises an indium tin oxide.

11. The method of claim 10, wherein the electroforming process further comprising:

depositing a first sub-layer and a second sub-layer of the metal layer between the photoresist pattern, the photoresist pattern including at least a first photoresist sub-layer, a second photoresist sub-layer, and a third photoresist sub-layer, the first sub-layer of the metal layer located between the first photoresist sub-layer and the second photoresist sub-layer, the second sub-layer of the metal layer located between the second photoresist sub-layer and the third photoresist sub-layer.

12. The method of claim 11, wherein the first sub-layer of the metal layer is isolated from the second sub-layer of the metal layer.

13. The method of claim 11, wherein the first sub-layer of the metal layer is connected to the second sub-layer of the metal layer through a third sub-layer of the metal layer.

14. The method of claim 10, wherein the metal layer comprises chromium.

15. The method of claim 10, wherein the base layer, the patterned conductive layer and the metal layer forms a mask for semiconductor manufacturing.

* * * * *